United States Patent [19]
Fong et al.

[11] Patent Number: 5,877,654
[45] Date of Patent: Mar. 2, 1999

[54] CLASS A AMPLIFIER WITH A DIGITALLY PROGRAMMABLE MILLER COMPENSATION NETWORK

[75] Inventors: Joseph Yves Chan Yan Fong; Mathew A. Rybicki, both of Austin, Tex.

[73] Assignee: Motorola Inc., Austin, Tex.

[21] Appl. No.: 758,658

[22] Filed: Dec. 2, 1996

[51] Int. Cl.$^6$ .................................................. H03F 1/14
[52] U.S. Cl. ............................................. 330/292; 330/76
[58] Field of Search ............................ 330/51, 109, 253, 330/292, 294, 86, 76

[56] References Cited

U.S. PATENT DOCUMENTS

| | | | |
|---|---|---|---|
| 4,500,846 | 2/1985 | Lewyn et al. | 330/253 |
| 4,943,784 | 7/1990 | Rybicki | 330/264 |
| 5,079,514 | 1/1992 | Mijuskovic | 330/292 X |
| 5,485,121 | 1/1996 | Huijsing et al. | 330/292 X |

OTHER PUBLICATIONS

Paul R. Gray, et al., "Analysis and Design of Analog Integrated Circuits", 1977 by John Wiley & Sons, Inc., pp. 741–749.

Paul R. Gray, et al., "MOS Operational Amplifier Design—A Tutorial Overview", IEEE J. Solid–State Circuits, vol.SC–17, No.6, pp. 969–982, Dec. 1982.

Primary Examiner—Steven Mottola
Attorney, Agent, or Firm—Craig J. Yudell; Daniel D. Hill

[57] ABSTRACT

A class A driver circuit (30) has an output stage with a plurality of selectable current sources (42). The selectable current sources (42) are used to optimize the drive capability of the output stage of the class A driver circuit (30) for different applications having different output impedance. In one embodiment, the selectable current sources (42) may be selectable, or switchable, using software programmed by a user. In another embodiment, the current sources may be automatically selected, based on sensing the output current provided to a resistive load. Also, in yet another embodiment, the selectable current sources (42) may be selectable based on the input signal of a first stage amplifier (32). A Miller compensation network (40) includes digitally controlled, switchable capacitors (129) and resistors (128), and provides the necessary amount of Miller compensation for the selected current sources.

31 Claims, 4 Drawing Sheets

CLASS A AMPLIFIER WITH A DIGITALLY PROGRAMMABLE MILLER COMPENSATION NETWORK

FIELD OF THE INVENTION

This invention relates generally to circuits, and more particularly, to a class A driver circuit with a digitally programmable Miller compensation network.

BACKGROUND OF THE INVENTION

FIG. 1 illustrates, in partial schematic diagram form and partial block diagram form a class A driver circuit 10 in accordance with the prior art. Class A driver circuit 10 includes P-channel transistors 14 and 18, current source 16, differential amplifier 12, current source 24, N-channel transistor 26, Miller compensation capacitor 22, and zero nulling resistor 20. Prior art class A driver circuit 10 is for driving a load impedance 28.

Class A driver circuit 10 includes two stages. A first stage includes differential amplifier 12 and a second stage includes current source 24 and N-channel transistor 26. The Miller compensation circuit includes series-connected resistor 20 and capacitor 22, and connects an output terminal of differential amplifier 12 to an input terminal of the second stage amplifier. Miller compensation is typically used to provide stability to the output terminal of differential amplifier 12. P-channel transistors 14, 18, and current source 16 provide a current source for differential amplifier 12.

Prior art class A driver 10 may be used in a variety of applications. A class A driver of this type is used in high performance systems requiring good drive strength with high linearity. The class A amplifier is also useful for driving loads that are highly resistive in addition to being capacitive. It may also be important for a class A amplifier to provide relatively low power consumption, such as in battery powered applications.

Typically, the circuit design for this type of class A driver is optimized for a worst case load. Depending upon the particular application, load impedance 28 may have a resistive component between, for example, 400 ohms ($\Omega$) and 100 kilo-ohms (K$\Omega$). In this case, the 400 $\Omega$ load may be considered the worst case load. However, if the application requires a 100 K$\Omega$ load, the current requirements to drive load impedance 28 would be reduced so that the second stage driver, which was designed for the worst case load of 400 $\Omega$, would waste a lot of power driving the 100 K$\Omega$ load.

DESCRIPTION OF A PREFERRED EMBODIMENT

Generally the present invention provides a class A driver circuit having an output stage with a plurality of selectable current sources. The selectable current sources are used to optimize the drive capability of the second stage of a class A driver circuit for different applications having different output impedance. In one embodiment, the plurality of current sources may be selectable, or switchable, using software programmed by a user. In another embodiment, the current sources may be automatically selected, based on sensing the output current provided to a resistive load. Also, in yet another embodiment, the current sources may be selectable based on the input signal of a first stage differential amplifier. When adjusting the plurality of current sources to provide the necessary drive capability, a Miller compensation network including digitally controlled, switchable capacitors and resistors are provided in order to provide the necessary amount of Miller compensation for the amplifier based on the selected current sources. The Miller compensation is provided to ensure pole splitting, and the selectable resistors are provided for nulling the right-half-plane zero brought by the Miller capacitor.

Figure 1:
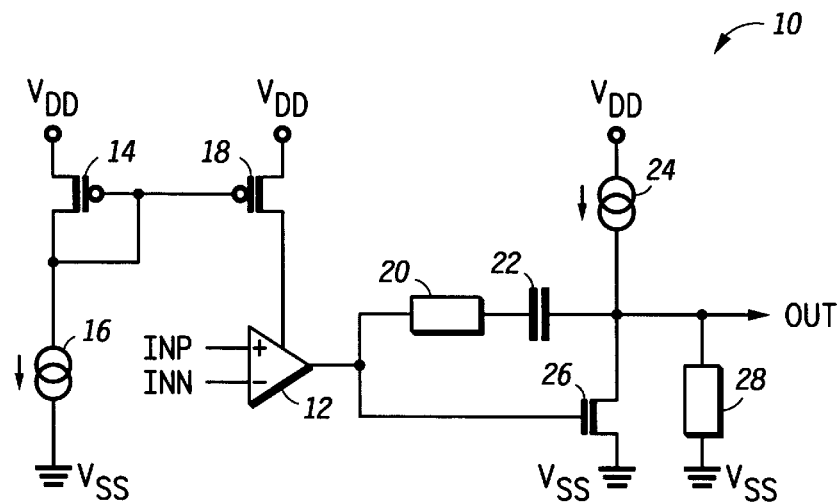
FIG. 1 illustrates, in partial schematic diagram form and partial block diagram form a class A driver circuit in accordance with the prior art.
Figure 2:
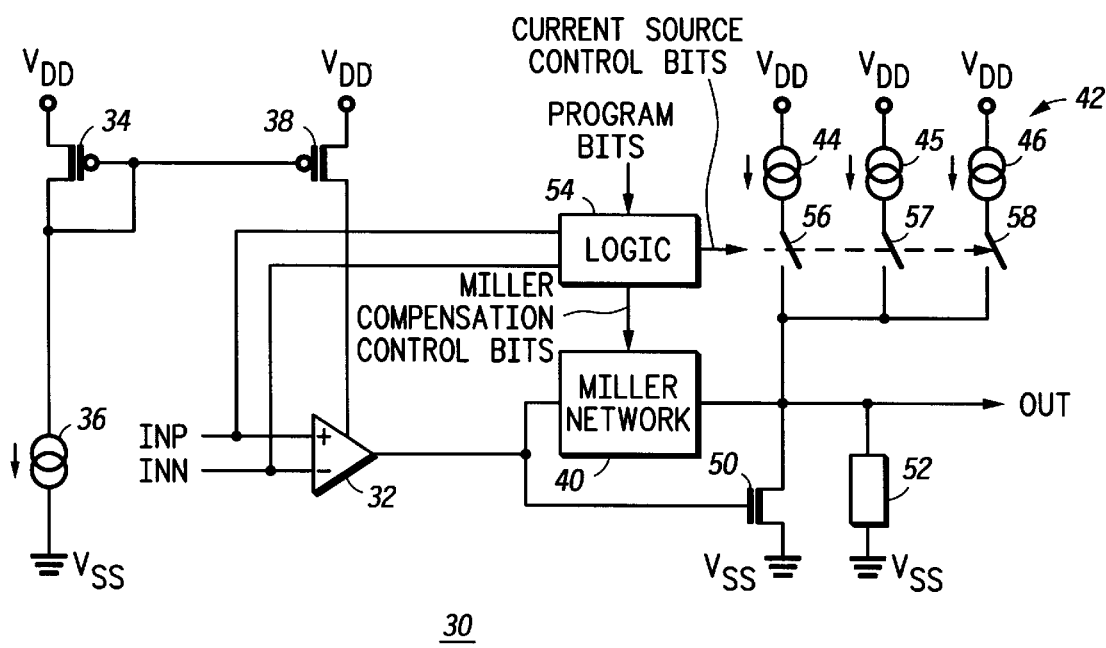
FIG. 2 illustrates, in schematic diagram form, class A driver circuit in accordance with one embodiment of the present invention.

FIG. 2 illustrates, in schematic diagram form, class A driver circuit 30 in accordance with one embodiment of the present invention. Class A driver circuit 30 includes P-channel transistors 34 and 38, current source 36, differential amplifier 32, logic circuit 54, Miller compensation network 40, a plurality of current sources 42, a plurality of switches 56–58, an N-channel transistor 50, and a load impedance 52. Switches 56–58 are used to couple a corresponding current source of plurality of current sources 42 to an output node labeled "OUT".

P-channel transistors 34 and 38 and current source 36 provide a bias current for differential amplifier 32. Differential amplifier 32 is a conventional first stage amplifier for class A driver circuit 30, and receives differential input signals labeled "INP" and "INN". A second stage is provided by the plurality of current sources 42 and N-channel transistor 50, which acts as an amplifying device. Miller compensation network 40 having a selectable resistance and a selectable capacitance is coupled between differential amplifier 32 and the second stage amplifier. Control logic circuit 54 receives a plurality of input signals labeled "PROGRAM BITS" and provides a first plurality of output signals labeled "CURRENT SOURCE CONTROL BITS", and a second plurality of output signals labeled "MILLER COMPENSATION CONTROL BITS". In response to the PROGRAM BITS, the CURRENT SOURCE CONTROL BITS determine which of the plurality of current sources 42 are connected to output OUT for driving impedance 52. Also, control logic circuit 54 provides MILLER COMPENSATION CONTROL BITS to Miller compensation network 40 for selecting the amount of compensation used in class A driver circuit 30 depending on how many of the current sources of the plurality of current sources 42 are selected. The Miller compensation network 40 provides good stability and good settling time for the output OUT of differential amplifier 32.

Each of the plurality of current sources 42 includes a current source connected in series with a switch. For example, current source 44 is connected in series with a switch 56 between a power supply voltage terminal labeled "VDD" and an output OUT of the second stage. Current source 45 is connected in series with switch 57 and current source 46 is connected in series with switch 58 in like manner. Switches 56, 57, and 58 may be implemented as PMOS (p-type metal-oxide semiconductor) transistors, each having a source connected to the current source, a drain connected to output OUT of the second stage; and a gate for receiving CURRENT SOURCE CONTROL BITS. As will be understood by those skilled in the art, the embodiment of FIG. 2 can be configured in an alternative embodiment forming a symmetrical amplifier where N-channel devices are replaced with P-channel devices, with the appropriate voltage supplies applied, and vice versa.

Figure 5:
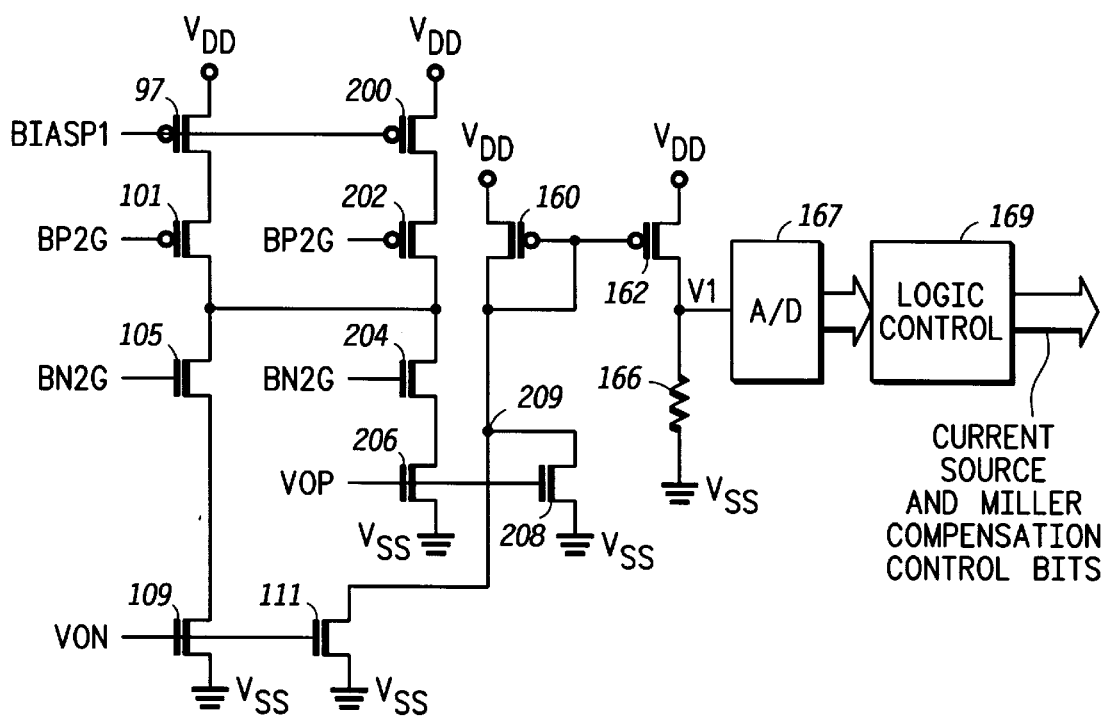
FIG. 5 illustrates, in schematic diagram form, an automatic control circuit for the class A driver circuit illustrated in FIG. 3.

In FIG. 2, two embodiments are illustrated for current source programmability and the corresponding Miller compensation programmability. In one embodiment, PROGRAM BITS may be provided, in software in an integrated circuit using class A driver circuit 30, which are user programmable through a register. In another embodiment, the PROGRAM BITS may be automatically generated using the input signals INP and INN as inputs to control logic circuit 54. In this embodiment, the control logic circuit 54 selects the number of current sources based on the amplitude of input signals INP and INN. For example, if the control logic circuit 54 detects that the input signals have a small amplitude, then relatively fewer currents sources of the second stage are selected. Also, in another embodiment, an automatic sensing circuit is coupled to an output of class A driver circuit 30, as illustrated in FIG. 5 and discussed below.

Class A driver circuit 30 provides an advantage of providing high drive capability as well as lower power consumption and good linearity by enabling programmable current source selection and digitally controlled Miller compensation. The correct amount of Miller compensation is provided for the amount of current drive used, maintaining good stability for the output of the differential amplifier stage. By providing the combination of digitally controlled Miller compensation with the plurality of selectable current sources, the class A driver circuit 30 can provide optimum performance at both low output impedance and high output impedance, while significantly reducing power consumption. Also, no external components are used for the programmability, which can be implemented in software, hardware, or a combination of software and hardware.

Figure 3:
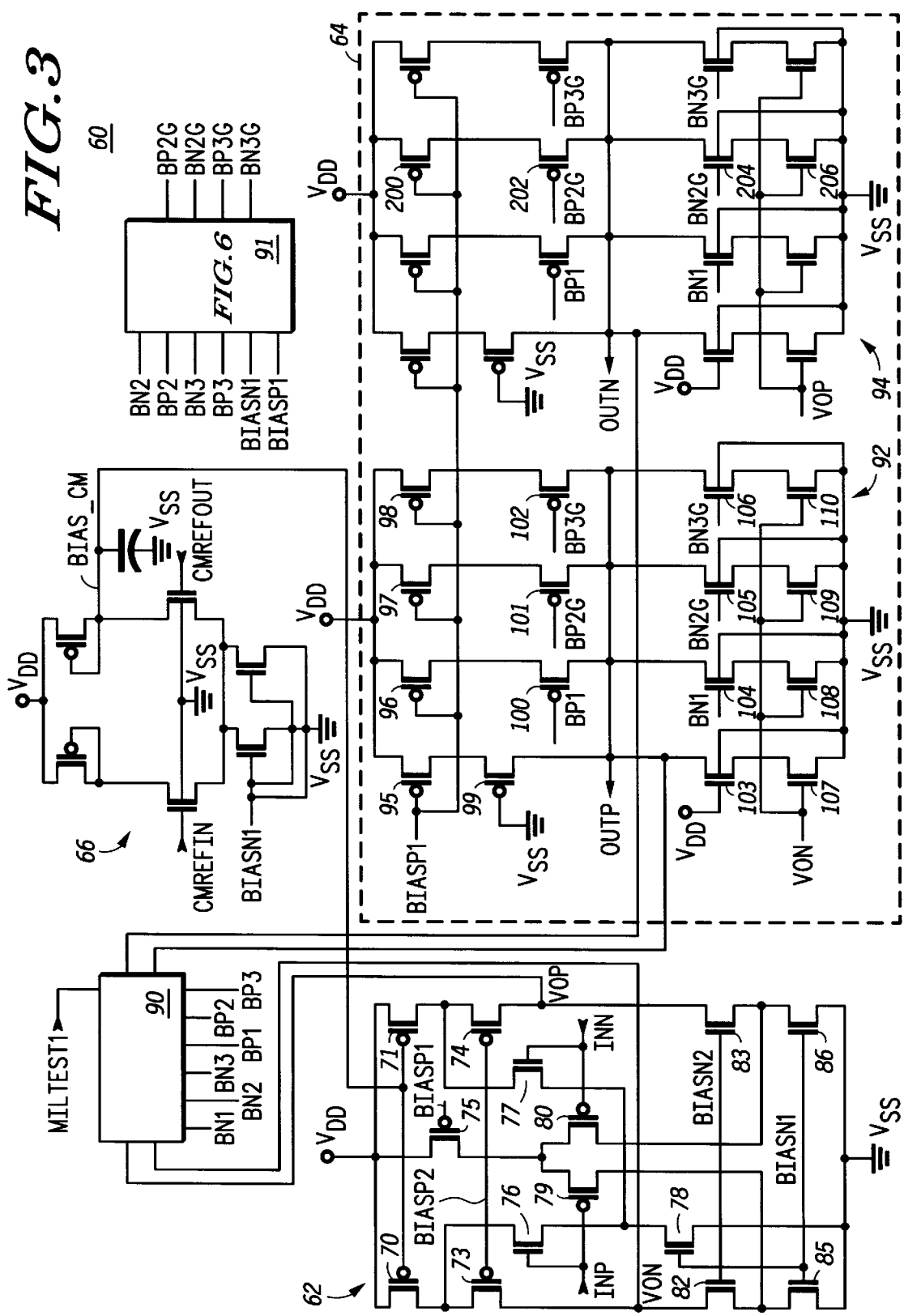
FIG. 3 illustrates, in schematic diagram form, a class A driver circuit in accordance with another embodiment of the present invention.

FIG. 3 illustrates, in schematic diagram form, class A driver circuit 60 in accordance with another embodiment of the present invention. Class A driver circuit 60 includes differential amplifier 62, common mode feedback amplifier 66, Miller compensation circuit 90, and output driver stage 64. Differential amplifier 62 includes P-channel transistors 70, 71, 73, 74, 75, 79 and 80, and N-channel transistors 76, 77, 78, 82, 83, 85, 86, and 78. Differential amplifier 62 is a conventional differential amplifier. Differential input signals labeled "INP" and "INN" are provided to a differential pair comprising N-channel transistors 76 and 77 and a differential pair comprising P-channel transistors 79 and 80. P-channel transistor 75 receives a bias voltage labeled "BIASP1" and provides a current source to the P-channel differential pair. N-channel transistor 78 receives a bias voltage labeled "BIASN1" and provides a current source for the N-channel differential pair. P-channel transistors 73 and 74 receive a bias voltage labeled "BIASP2" and are cascode devices for gain enhancement in differential amplifier 62. Likewise, N-channel transistors 82 and 83 receive a bias voltage labeled "BIASN2", and are cascode devices for gain enhancement in differential amplifier 62.

A common mode circuit 66 provides a common mode bias voltage labeled "BIAS CM" to the gates of P-channel transistors 70 and 71 and functions to provide common mode control for differential amplifier 62. Common mode control circuit 66 receives differential common mode signals labeled CMREFIN and CMREFOUT. CMREFIN is a reference voltage, and CMREFOUT is the common mode output of differential amplifier 60. The common mode reference voltages are chosen such that the common mode voltage of differential amplifier 60 is at the optimum DC level for the particular application. Generally, the common mode point is chosen to be about half way between the low and high voltage swings of the differential amplifier output signals. In this case, differential amplifier 62 provides opposite polarity output signals labeled "VON" and "VOP".

Input terminals of Miller compensation circuit 90 are connected to the output terminals of differential amplifier 62. Miller compensation circuit 90 is illustrated in more detail in FIG. 4 and will be discussed later. Differential output stages 64 includes a first half 92 and a second half 94. The first half 92 is coupled to one of the output terminals of differential amplifier 62 via Miller compensation circuit 90 and the second half 94 coupled to the other differential amplifier 62 output terminal via Miller compensation 90. Class A driver circuit 60 is fully symmetrical, that is, first half 92 and second half 94 are substantially the same. Therefore, the operation of output stages 64 will be described by referring only to first half 92. First half 92 includes P-channel transistors 95–102 and N-channel transistors 103–110. P-channel transistors 95 and 99 and N-channel transistors 103 and 107 form one "leg" of output stage 64. First half 92 includes four legs, three of the legs being programmable.

P-channel transistor 95 acts as a current source and has a source connected to a power supply terminal labeled "VDD", a gate for receiving the bias voltage, BIASP1, and a drain. P-channel transistor 99 acts as a switchable cascode transistor and has a source connected to the drain of P-channel transistor 95, a gate connected to a power supply voltage terminal labeled "VSS", and a drain for providing an output signal labeled "OUTP". N-channel transistor 103 acts as a switchable cascode transistor and has a drain connected to the drain of P-channel transistor 99, a gate connected to VDD, and a source. N-channel transistor 107 acts as an amplifying transistor and has a drain connected to the source of N-channel transistor 103, a gate for receiving output signal VON and a source connected to VSS. P-channel transistor 96 has a source connected to VDD, a gate for receiving bias voltage BIASP1 and a drain. P-channel transistor 100 has a source connected to the drain of P-channel transistor 96, a gate for receiving a control signal labeled BP1 and a drain connected to output terminal OUT. N-channel transistor 104 has a drain connected to the drain of P-channel transistor 100, a gate for receiving control signal BN1 and a source. N-channel transistor 108 has a drain connected to the source of N-channel transistor 104, a gate for receiving output signal VON and a source connected to VSS.

P-channel transistors 97, 101, N-channel transistors 105, 109 are connected in series in a manner similar to P-channel transistors 96 and 100 and N-channel transistors 104 and 108. Also P-channel transistors 98 and 102 and N-channel transistors 106 and 110 are connected in a similar fashion (as are P-channel transistors 200, 202 and N-channel transistors 204, 206 comprising one leg of second half 94). In the illustrated embodiment, each of P-channel transistors 95, 96, 97 and 98 have the same size and dimensions. In other embodiments, The P-channel transistors may be different sizes, for example, the sizes may be ratioed, or binary weighted.

Current sources comprising P-channel transistors 96, 97 and 98 can be coupled to output terminal OUTP in any combination either singularly or altogether to provide the required amount of drive capability, depending upon the load resistance (not shown) coupled to OUTP. P-channel transistors 99, 100, 101 and 102 function as switches in response to the control signals. Note that P-channel transistor 99 has its gate connected to VSS and N-channel transistor 103 has its gate connected to VDD, thereby providing a minimum output drive capability for first half 92. In other embodiments, such as when the current sources are binary weighted, it may also be desirable to make P-channel transistor 99 switchable. N-channel transistors 104, 105, and 106 receive control bits BN1, BN2G, BN3G, respectively for coupling a plurality of current sinks, comprising N-channel transistors 108, 109 and 110, to output terminal OUTP.

Figure 4:
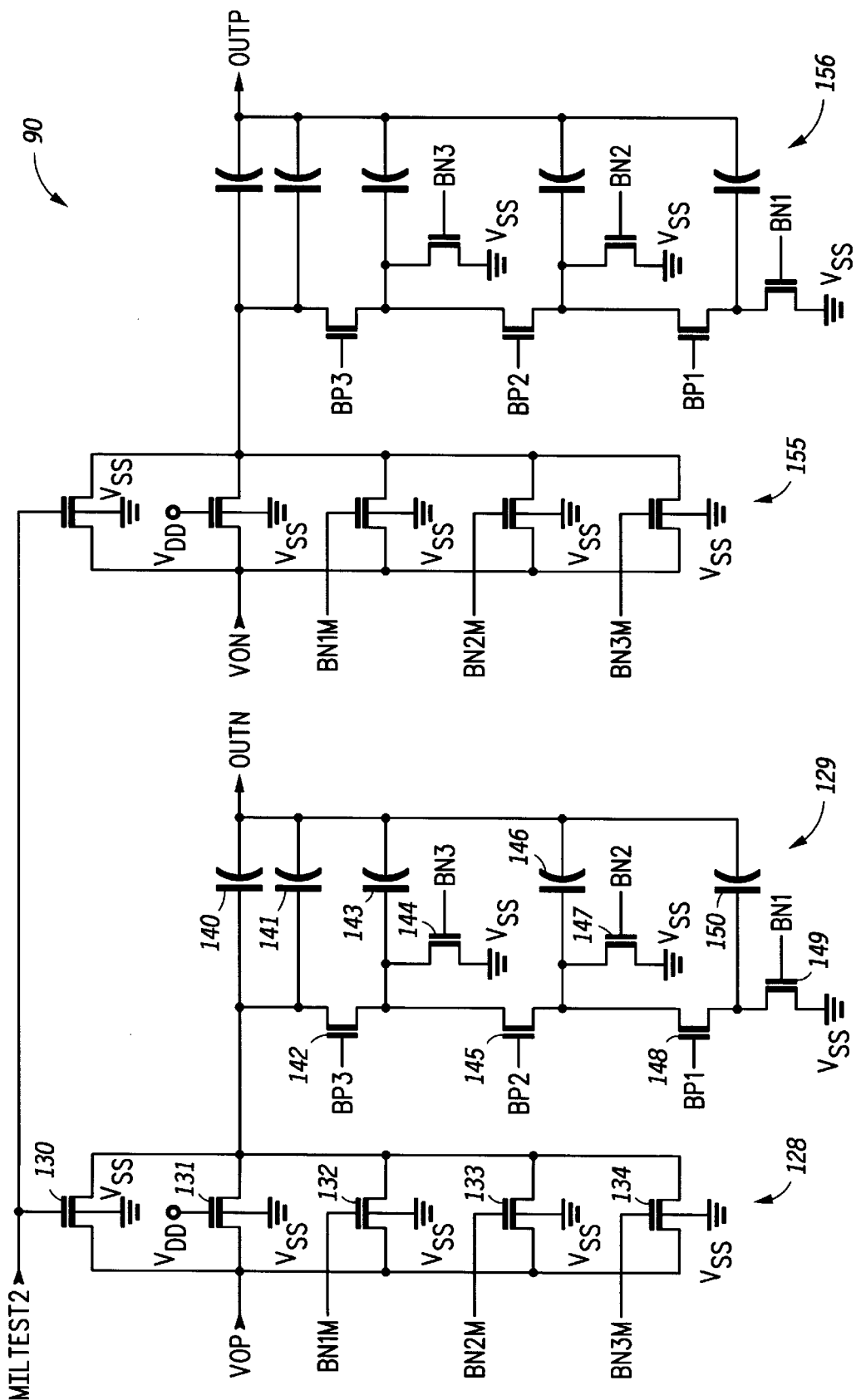
FIG. 4 illustrates one embodiment of a Miller compensation network of the class A driver circuit of FIG. 3.

FIG. 4 illustrates one embodiment of Miller compensation network 90. Miller compensation network 90 includes a plurality of resistive elements coupled in parallel, the resistive elements including resistive elements 130, 131, 132, 133 and 134 in a plurality of resistive elements 128. The plurality of resistive elements 128 function to provide zero compensation for Miller compensation network 90. Any one, or all, of the plurality of resistors 128 may be coupled together in parallel.

Resistive element 130 has a gate for receiving a control signal labeled MILTEST2. This resistive element is used for providing compensation during test to account for temperature and process variations. N-channel transistor 131 has its gate coupled to VDD and N-channel transistor 131 provides a non-zero resistance for Miller compensation network 90. N-channel transistor 132 receives a control bit labeled "BN1M". N-channel transistor 133 receives a control bit labeled "BN2M", and N-channel transistor 134 receives a control bit labeled "BN3M". Each of transistors 132, 133 or 134 can be coupled in parallel to provide a reduced resistance for Miller compensation network 90.

A plurality of capacitors 129 are coupled in series with the plurality of resistive elements 128. A capacitor 140 provides a minimum amount of capacitance for Miller compensation network 90 and is always selected. Capacitors 141, 143, 146 and 150 are each individually selectable, and are added as parallel capacitance for Miller compensation network 90. N-channel transistor 142 receives control bit "BP3" and is used to couple capacitor 143 in parallel with capacitors 140 and 141. In order to couple capacitor 146 in parallel, both of N-channel transistors 142 and 145 must be conductive. N-channel transistors 144 and 147 and 149 are provided to couple unused capacitors to ground to prevent a capacitor plate from floating. In one embodiment, the capacitors are implemented as polysilicon plate capacitors. However, in other embodiments, the capacitors may be formed from MOS (metal-oxide semiconductor) transistors. A plurality of resistive elements 155 and a plurality of capacitors 146 are coupled to the output VON of differential amplifier 60 of FIG. 3 in a similar manner.

FIG. 5 illustrates, in schematic diagram form, an automatic control circuit for the class A driver circuit 60 illustrated in FIG. 3. Note that like elements of FIGS. 3 and 5 have the same reference numbers. For the purposes of clarity and simplicity only one leg of each half 92 and 94 from FIG. 3 are illustrated in FIG. 5. A sensing circuit comprising N-channel transistors 111, 208 receives differential output voltages VON and VOP, respectively, from the output of differential amplifier 62. In other embodiments, an N-channel transistor similar to N-channel transistors 111 and 208 may be provided corresponding to each or another of the N-channel transistors 107, 108, 109 and 110 in first half 92 and each or another of the legs in second half 94 illustrated in FIG. 3.

In response to output signals VON and VOP, the currents through N-channel sense transistors 111 and 208 are summed at current summing node 209. The summed current is mirrored through P-channel transistor 162 by P-channel transistor 160. Resistor 166 converts the current through P-channel transistor 162 to a voltage labeled "V1". A resistance of resistor 166 sets the voltage level received by analog to digital (A/D) converter 167. A/D converter 167 receives voltage V1 and provides a digital representation of voltage V1. A/D converter 162 may be a simple, conventional A/D converter based on successive approximation. The digital signals provided by A/D converter 167 are provided to the input terminals of logic circuit 169. In response, Logic circuit 169 then provides "CURRENT SOURCE AND MILLER COMPENSATION CONTROL BITS" to select which of the plurality of current sources are to provide current for an optimized circuit, and for programming the corresponding Miller compensation for that optimized circuit configuration. The control bits are provided to each of the switches illustrated in FIG. 3 of first half 92 and second half 94 of output stage 64.

The number of current sources coupled to the output terminal of one of the output stages depends upon the sensed voltage V1, where logic control circuit 169 automatically adjusts a number of current sources used to drive an external load. In one embodiment, this current source adjustment would be done during power up of an integrated circuit using differential class A driver 60. In another embodiment, such as described in FIG. 2, the selection of current sources may be accomplished on the "fly", or dynamically. If the current sources are switched on the fly, the act of switching transistors 99–102 on and off may cause unwanted transients, or noise, in output of the class A amplifier circuit. A glitch control circuit, such as glitch control circuits 174 and 186, may be used to provide relatively glitchless operation of switches 99–102 and 103–106 in FIG. 3.

Figure 6:
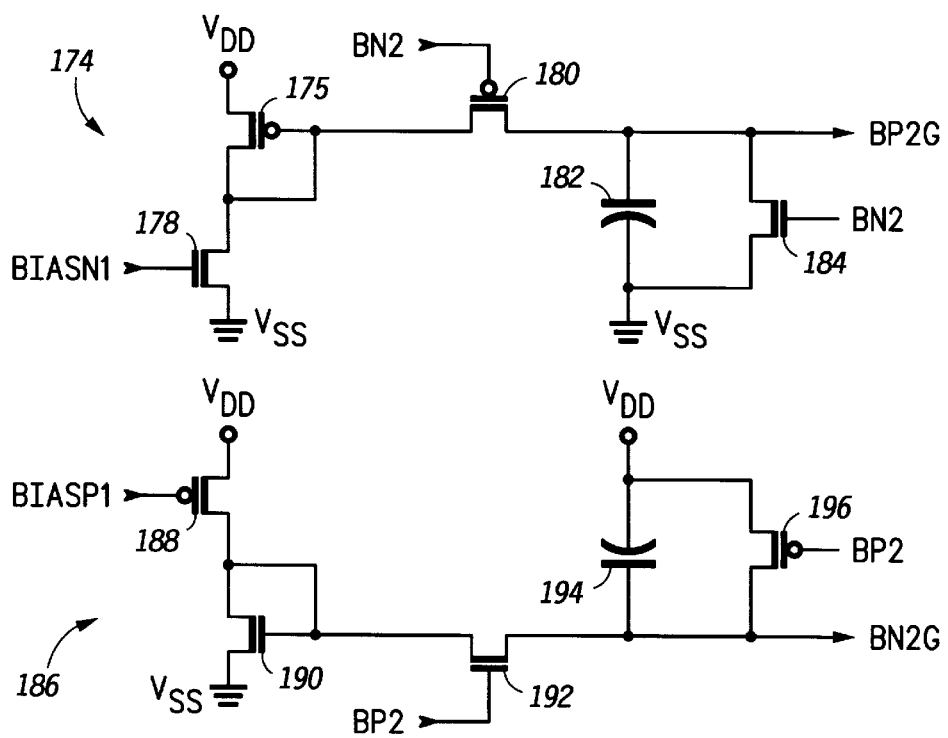
FIG. 6 illustrates, in schematic diagram form, glitch control circuits for use with the class A driver circuit illustrated in FIG. 3.

FIG. 6 illustrates, in schematic diagram form, glitch control circuits 174 and 186. Glitch control circuit 174 includes N-channel transistors 178 and 184, P-channel transistors 175 and 180, and capacitor 182. Glitch control circuit 174 is used to control switching noise of P-channel transistor 101 of FIG. 3. A glitch control circuit similar to glitch control circuit 174 is used to reduce switching noise for each of the other corresponding P-channel transistors of first half 92 and second half 94, such as P-channel transistors 100 and 102.

Glitch control circuit 186 includes N-channel transistors 190 and 192, P-channel transistors 188 and 196, and capacitor 194. Glitch control circuit 186 is used to control the switching noise of N-channel transistor 105 of FIG. 3. A glitch control circuit similar to glitch control circuit 186 is used to reduce the switching noise for each of the other corresponding N-channel transistors of first half 92 and second half 94, such as N-channel transistors 104 and 106.

Control signal BN2 is provided to the gates of N-channel transistor 184 and P-channel transistor 180. When control signal BN2 is a logic low voltage (inactive), P-channel transistor 180 is conductive and N-channel transistor 184 is substantially non-conductive. Bias voltage BIASN1 causes a small constant current in N-channel transistor 178, and P-channel transistor 175 mirrors this current through P-channel transistor 101 when BN2 is inactive.

When control signal BN2 is a logic high voltage (active), P-channel transistor 180 is substantially non-conductive and N-channel transistor 184 is conductive. The voltage of control signal BP2G is pulled to a low voltage equal to about VSS, causing P-channel transistor 101 (FIG. 5) to be conductive. Capacitor 182 is coupled between a drain/source terminal of P-channel transistor 180 and VSS, and provides stabilization for the voltage switching of control signal BP2G.

Glitch control circuit 186 functions similarly to glitch control circuit 174. Control signal BP2 is provided to the gates of N-channel transistor 192 and P-channel transistor 196. When control signal BP2 is a logic low voltage (active), N-channel transistor 192 is substantially non-conductive and P-channel transistor 196 is conductive. The voltage of control signal BN2G is increased to a high voltage equal to about VDD, causing N-channel transistor 105 (FIG. 3) to be conductive. When control signal BP2 is a logic high voltage (inactive), N-channel transistor 192 is conductive and P-channel transistor 196 is substantially non-conductive. Bias voltage BIASP1 causes a small constant current in P-channel transistor 188, and N-channel transistor 190 mirrors this current through N-channel transistor 105 (FIG. 5) when BP2 is inactive. Because of the small mirrored current through N-channel transistor 105, N-channel transistor 105 is always at least slightly conductive; this produces less switching noise when it is switched on by BN2G. Capacitor 194 is coupled between a drain/source terminal of N-channel transistor 192 and VDD, and provides stabilization for the voltage switching of control signal BN2G.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An amplifier comprising:
    a first stage amplifier having an output;
    a second stage amplifier having an input and an output, wherein the input is connected to the output of the first stage; and
    a digitally programmable Miller network having a plurality of switchable capacitive elements connected between the output of the first stage amplifier and the output of the second stage amplifier, wherein each capacitive element of the plurality of switchable capacitive elements has a node connected to a first node of a corresponding transistor and, wherein a second node of each corresponding transistor is connected to a node of another of the plurality of capacitive elements, wherein one or more of the corresponding transistors are activated to connect two or more of the plurality of switchable capacitive elements in parallel.

2. An amplifier according to claim 1, wherein the first stage is a differential operational amplifier and the second stage has an amplifying device and a current source.

3. An amplifier according to claim 1, wherein the digitally programmable Miller network is automatically programmable.

4. An amplifier according to claim 1, further comprising a resistive element connected in series between the output of the first stage and the plurality of capacitive elements.

5. An amplifier according to claim 4, wherein the resistive element is a digitally controlled transistor.

6. An amplifier comprising:
    a first stage amplifier having an input and an output;
    a second stage amplifier having a first input, a first output, and a first set of switchable current sources electrically coupled in parallel to the first stage amplifier output, wherein the first input of the second stage is connected to the output of the first stage amplifier; and
    a digitally programmable Miller network having a plurality of switchable capacitive elements connected between the output of the first stage amplifier and the first output of the second stage amplifier.

7. An amplifier according to claim 6, further comprising a logic circuit that receives program signals from a register and switches one or more of the first set of switchable current sources and switches one or more of the plurality of switchable capacitive elements in response to the program signals.

8. An amplifier according to claim 6, wherein the digitally programmable Miller network further comprises a plurality of selectable resistive elements.

9. An amplifier according to claim 6, wherein the first set of switchable current sources includes a current source transistor in series with a first switchable cascode transistor and a second switchable cascode transistor in series with an amplifying transistor.

10. An amplifier according to claim 6, wherein the input to the first stage is a differential input and the output of the first stage is a differential output having a first polarity signal and a second polarity signal, and further wherein the second stage amplifier further comprises a second input and a second output, wherein the first input of the second stage is connected to the first polarity signal and the second input of the second stage is connected to the second polarity signal, and further comprising a second set of current sources connected in parallel to the second output of the second stage amplifier.

11. An amplifier according to claim 10, further comprising a common mode regulation circuit having a first input, a second input and an output, wherein the first input is connected to the first output and the second output of the second stage amplifier, the second input is connected to a reference voltage and the output provides a control signal to the first stage amplifier that regulates the output of the amplifier.

12. An amplifier according to claim 6, further comprising an automatic control circuit that receives one or more program signals and switches one or more of the first set of switchable current sources and one or more of the switchable capacitive elements as a function of the one or more program signals.

13. An amplifier according to claim 12, wherein the automatic control circuit further comprises:
    one or more sense transistors connected in parallel to a current summing node, wherein the one or more sense transistors are controlled by at least the first output of the first stage;
    a current mirror having an output and an input, the current summing node being connected to the input of the current mirror; and
    an analog-to-digital converter having an analog input and a digital output, the output of the current mirror being connected to the input of the analog-to-digital converter and the analog-to-digital converter outputting one or more program signals.

14. An amplifier according to claim 12, wherein the automatic control circuit receives the input to the first stage amplifier, and further wherein the automatic control determines an amplitude of the input to the first stage amplifier, and outputs the one or more program signals as a function of the amplitude.

15. An amplifier according to claim 6, wherein the first stage is a differential operational amplifier and the second stage has an amplifying device and a current source.

16. An amplifier according to claim 6, wherein the digitally programmable Miller network is automatically programmable.

17. An amplifier according to claim 6, wherein each capacitive element of the plurality of switchable capacitive elements has a node connected to a first node of a corresponding transistor and wherein a second node of each corresponding transistor is connected to a node of another of the plurality of capacitive elements, wherein one or more of the corresponding transistors are activated to connect two or more of the plurality of capacitive elements in parallel.

18. An amplifier according to claim 6, further comprising a resistive element connected in series between the output of the first stage and the plurality of switchable capacitive elements.

19. An amplifier according to claim 18, wherein the resistive element is one or more digitally controlled transistor.

20. An amplifier comprising:
a first stage amplifier having an input and an output;
a second stage amplifier having a first input, a first output, and a first set of switchable current sources electrically coupled in parallel to the output, wherein the first input of the second stage is connected to the output of the first stage;
a digitally programmable Miller network having a plurality of switchable capacitive elements connected between the output of the first stage amplifier and the first output of this second stage amplifier; and
an automatic control circuit that receives one or more program signals and switches one or more of the first set of switchable current sources and one or more of the switchable capacitive elements as a function of the one or more program signals.

21. An amplifier according to claim 20, wherein the automatic control circuit further comprises:
one or more sense transistors connected in parallel to a current summing node, wherein the one or more sense transistors are controlled by at least the first output of the first stage;
a current mirror having an output and an input, the current summing node being connected to the input of the current mirror; and
an analog-to-digital converter having an analog input and a digital output, the output of the current mirror being connected to the input of the analog-to-digital converter and the analog-to-digital converter outputting one or more program signals.

22. An amplifier according to claim 20, wherein the automatic control circuit receives the input to the first stage amplifier, and further wherein the automatic control determines an amplitude of the input to the first stage amplifier, and outputs the one or more program signals as a function of the amplitude.

23. An amplifier according to claim 20, wherein the first stage is a differential operational amplifier and the second stage has an amplifying device and a current source.

24. An amplifier according to claim 20, wherein each capacitive element of the plurality of switchable capacitive elements has a node connected to a first node of a corresponding transistor and, wherein a second node of each corresponding transistor is connected to a node of another of the plurality of capacitive elements, wherein one or more of the corresponding transistors are activated to connect two or more of the plurality of switchable capacitive elements in parallel.

25. An amplifier according to claim 20, wherein the digitally programmable Miller network is automatically programmable.

26. An amplifier according to claim 20, further comprising a resistive element connected in series between the output of the first stage and the plurality of capacitive elements.

27. An amplifier according to claim 20, wherein the digitally programmable Miller network further comprises a plurality of switchable selectable resistive elements.

28. An amplifier according to claim 27, wherein the plurality of selectable resistive elements are digitally controlled transistors.

29. An amplifier according to claim 20, wherein the first set of switchable current sources includes a current source transistor in series with a first switchable cascode transistor and a second switchable cascode transistor in series with an amplifying transistor.

30. An amplifier according to claim 20, wherein the input to the first stage is a differential input and the output of the first stage is a differential output having a first polarity signal and second polarity signal, and further wherein the second stage amplifier further comprises a second input and a second output, wherein the first input of the second stage is connected to the first polarity signal and the second input of the second stage is connected to the second polarity signal, and further comprising a second set of current sources connected in parallel to the second output of the second stage amplifier.

31. An amplifier according to claim 30, further comprising a common mode regulation circuit having a first input, a second input and an output, wherein the first inputs connected to the first output and the second output of the second stage amplifier, the second input is connected to a reference voltage and the output provides a control signal to the first stage amplifier that regulates the output of the amplifier.

* * * * *